United States Patent
Qian

(10) Patent No.: US 9,437,325 B2
(45) Date of Patent: Sep. 6, 2016

(54) TFT ARRAY SUBSTRATE, DISPLAY PANEL AND DISPLAY DEVICE

(71) Applicants: Shanghai Tianma AM-OLED Co., Ltd., Shanghai (CN); Tianma Micro-Electronics Co., Ltd., Shenzhen (CN)

(72) Inventor: Dong Qian, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 165 days.

(21) Appl. No.: 14/466,926

(22) Filed: Aug. 22, 2014

(65) Prior Publication Data
US 2015/0340102 A1    Nov. 26, 2015

(30) Foreign Application Priority Data

May 21, 2014    (CN) .......................... 2014 1 0217830

(51) Int. Cl.
G11C 19/28 (2006.01)
G09G 3/36 (2006.01)
G11C 27/04 (2006.01)
H01L 27/12 (2006.01)
G09G 3/20 (2006.01)

(52) U.S. Cl.
CPC .............. *G11C 27/04* (2013.01); *G09G 3/2092* (2013.01); *G09G 3/3677* (2013.01); *H01L 27/124* (2013.01); *H01L 27/1255* (2013.01); *G09G 2300/0417* (2013.01); *G09G 2300/0426* (2013.01); *G09G 2300/0465* (2013.01); *G09G 2310/0224* (2013.01); *G09G 2310/0286* (2013.01); *G09G 2310/061* (2013.01); *G09G 2330/021* (2013.01)

(58) Field of Classification Search
CPC .............. G11C 19/18–19/184; G11C 19/188; G11C 19/28; G09G 3/3674; G09G 2310/0286
See application file for complete search history.

(56) References Cited

U.S. PATENT DOCUMENTS

| | | | |
|---|---|---|---|
| 7,639,226 B2 * | 12/2009 | Kim ....................... | G11C 19/28 345/100 |
| 8,462,098 B2 * | 6/2013 | Tobita .................. | G09G 3/3677 345/100 |
| 2010/0201666 A1 * | 8/2010 | Tobita .................. | G09G 3/3677 345/208 |

FOREIGN PATENT DOCUMENTS

| | | |
|---|---|---|
| CN | 102097132 A | 6/2011 |
| WO | 2013168603 A1 | 11/2013 |

* cited by examiner

*Primary Examiner* — Patrick O'Neill
(74) *Attorney, Agent, or Firm* — Alston & Bird LLP

(57) ABSTRACT

A TFT array substrate is disclosed. The TFT array substrate includes a plurality of gate lines, and a gate driving circuit connected to the gate lines. The gate driving circuit includes a plurality of stages of shift registers, where odd-numbered stages of shift registers are cascaded-connected to each other, even-numbered stages of shift registers are cascaded-connected to each other, and the odd-numbered stages of shift registers and the even-numbered stages of shift registers are disposed at opposite ends of the gate lines.

8 Claims, 6 Drawing Sheets

TFT ARRAY SUBSTRATE, DISPLAY PANEL AND DISPLAY DEVICE

CROSS-REFERENCES TO RELATED APPLICATIONS

This application claims the benefit of priority to Chinese Patent Application No. 201410217830.X, filed with the Chinese Patent Office on May 21, 2014 and entitled "TFT ARRAY SUBSTRATE, DISPLAY PANEL AND DISPLAY DEVICE", the content of which is incorporated herein by reference in its entirety.

TECHNICAL FIELD

The present disclosure relates to the field of display technologies, in particular to a TFT array substrate, a display panel and a display device.

BACKGROUND OF THE INVENTION

Currently, a display device has been used in increasing applications. In practice, however, it is found that the display device has problems such as high power consumption, a high cost, a low yield, and a large border width.

BRIEF SUMMARY OF THE INVENTION

One inventive aspect is a TFT array substrate. The TFT array substrate includes a plurality of gate lines, and a gate driving circuit connected to the gate lines. The gate driving circuit includes a plurality of stages of shift registers, where odd-numbered stages of shift registers are cascaded-connected to each other, even-numbered stages of shift registers are cascaded-connected to each other, and the odd-numbered stages of shift registers and the even-numbered stages of shift registers are disposed at opposite ends of the gate lines.

Another inventive aspect is a display panel, including a TFT array substrate. The TFT array substrate includes a plurality of gate lines, and a gate driving circuit connected to the gate lines. The gate driving circuit includes a plurality of stages of shift registers, where odd-numbered stages of shift registers are cascaded-connected to each other, even-numbered stages of shift registers are cascaded-connected to each other, and the odd-numbered stages of shift registers and the even-numbered stages of shift registers are disposed at opposite ends of the gate lines.

Another inventive aspect is a display device, including a TFT array substrate. The TFT array substrate includes a plurality of gate lines, and a gate driving circuit connected to the gate lines. The gate driving circuit includes a plurality of stages of shift registers, where odd-numbered stages of shift registers are cascaded-connected to each other, even-numbered stages of shift registers are cascaded-connected to each other, and the odd-numbered stages of shift registers and the even-numbered stages of shift registers are disposed at opposite ends of the gate lines.

DETAILED DESCRIPTION OF THE PREFERRED EMBODIMENTS

In order to make the above objects, features and advantages of the present disclosure more clear and apparent, specific embodiments of the present disclosure are illustrated in detail below in combination with the accompanying drawings.

Figure 1:
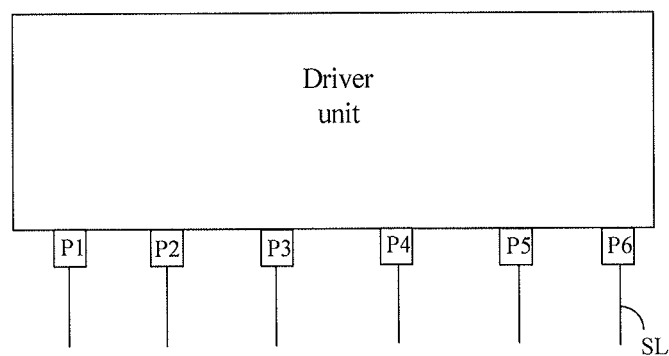
FIG. 1 is a schematic diagram showing connections between pins of a driver unit and signal lines in the prior art.

It has been found by researchers that problems of existing display devices such as high power consumption, a high cost, a low yield, and a large border width are caused by following reasons: as shown in FIG. 1, excessive signal lines (generally including six signal lines (SLs), i.e. three triggering signal lines and three resetting signal lines, where the three triggering signal lines are configured to sequentially trigger three consecutive odd-numbered stages of shift registers; and the three resetting signal lines are configured to sequentially reset three consecutive odd-numbered stages of shift registers; or, the three triggering signal lines are configured to sequentially trigger three consecutive even-numbered stages of shift registers and the three resetting signal lines are configured to sequentially reset three consecutive even-numbered stages of shift registers) are provided for a driving circuit of a thin film transistor (TFT) array substrate in the display device, which leads to excessive pins (P1, . . . , P6) of the driver unit corresponding to various signal lines (i.e. there are six pins, the amount of which is the same as that of the signal lines), resulting in an overload and high power consumption of the existing driver unit and complicated wirings within the driver unit, thus causing the high cost and the low yield of the driver unit, and hence high power consumption, a high cost and a low yield of the display device; further, because of the excessive signal lines provided for the driving circuit of the TFT array substrate, a large border width is occupied by the signal lines and thus the display device has a large border width.

It is further found by the researchers that both the triggering signal and the reset signal are pulse signals and both are regular in their phase cycles. If a pulse signal (e.g. a triggering signal) applied to a clock signal terminal is reused as a reset signal applied to a reset terminal, then resetting signal lines individually providing reset signals can be omitted, so that the amount of signal lines can be reduced and corresponding beneficial effects can also be obtained.

Figure 2:
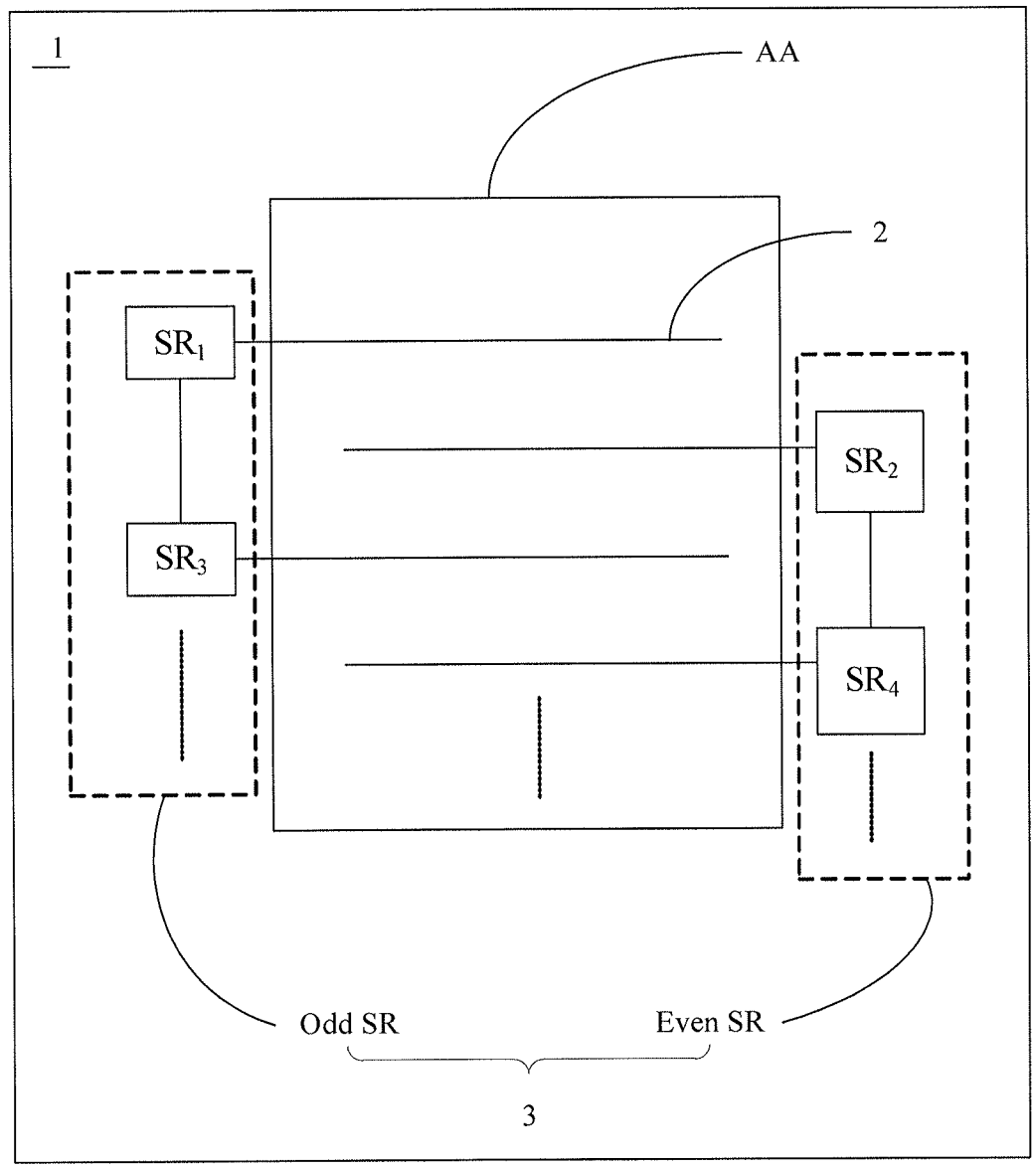
FIG. 2 is a schematic diagram showing a TFT array substrate according to the present disclosure.

Specifically, referring to FIG. 2, an embodiment provides a TFT array substrate 1, including: a plurality of gate lines 2, which are generally disposed within a display area AA; and a gate driving circuit 3 connected to the gate lines 2, with the gate driving circuit 3 including multiple stages of shift registers SRs, where, odd-numbered stages of shift registers from the multiple stages of shift registers (odd SRs) are cascaded-connected to each other, even-numbered stages of shift registers from the multiple stages of shift registers (even SRs) are cascaded-connected to each other, and the odd-numbered stages of shift registers (odd SRs) and the even-numbered stages of shift registers (even SRs) are respectively disposed at both ends of the gate lines 2. It is noted that, although the even-numbered stages of shift registers (even SRs) are disposed at right ends of the gate lines 2 and the odd-numbered stages of shift registers (odd SRs) are disposed at left ends of the gate lines 2 as shown in FIG. 2, for example, the present disclosure is not limited thereto. In other embodiments, the even-numbered stages of shift registers (even SRs) can be disposed at the left ends of the gate lines 2 and the odd-numbered stages of shift registers (odd SRs) can be disposed at the right ends of the gate lines 2.

Figure 3:
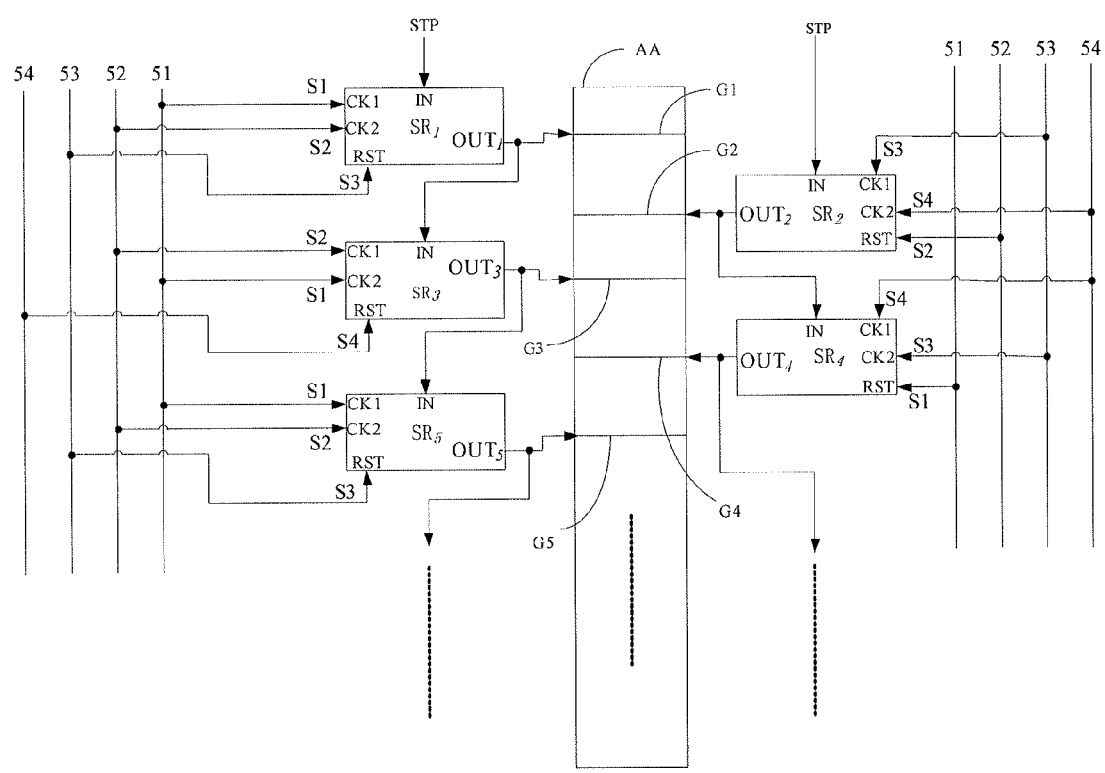
FIG. 3 is a schematic diagram showing the cascade connection of shift registers of a gate driving circuit according to the present disclosure.

As shown in FIG. 3, the gate driving circuit 3 further includes a first pulse signal line 51, a second pulse signal line 52, a third pulse signal line 53 and a fourth pulse signal line 54, and each of the multiple stages of shift registers ($SR_1, \ldots, SR_i$) includes an input terminal IN, an output terminal ($OUT_1, \ldots, OUT_i$), a first clock signal terminal CK1, a second clock signal terminal CK2, and a reset terminal RST. The output terminals ($OUT_1, \ldots, OUT_i$) of each of the multiple stages of shift registers ($SR_1, \ldots, SR_i$) are respectively connected to the corresponding gate line 2, for example, the output terminal $OUT_1$ of the first stage of shift register $SR_1$ is connected to the first row of gate lines G1, the output terminal $OUT_2$ of the second stage of shift register $SR_2$ is connected to the second row of gate lines G2, the output terminal $OUT_3$ of the third stage of shift register $SR_3$ is connected to the third row of gate lines G3, the output terminal $OUT_4$ of the fourth stage of shift register $SR_4$ is connected to the fourth row of gate lines G4, and so on, which is not repeatedly discussed again here in the present embodiment.

Figure 4:
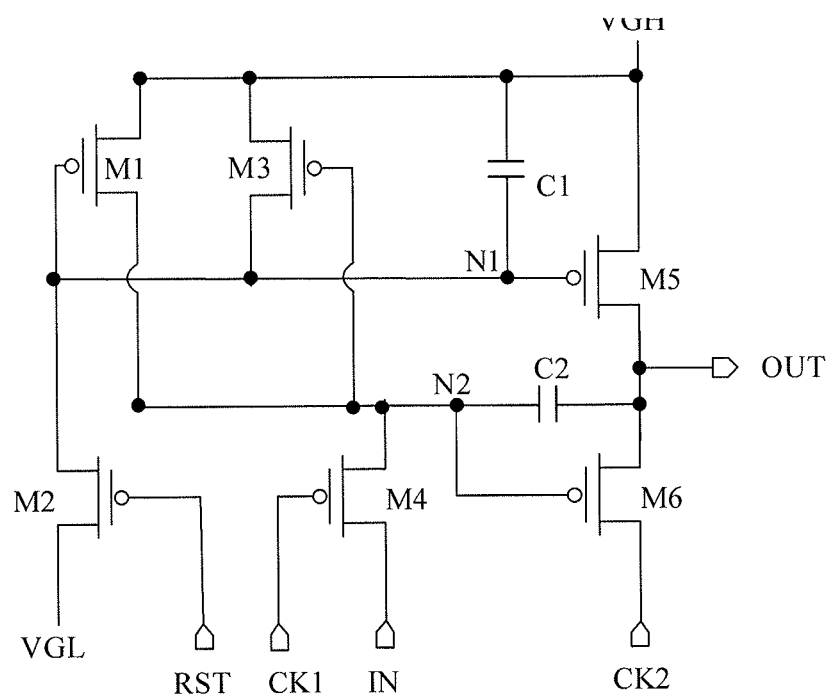
FIG. 4 is a schematic diagram showing the structure of a shift register according to the present disclosure.

Further, the first clock signal terminal CK1 of the first stage of shift register $SR_1$ is connected to the first pulse signal line 51 to receive the first pulse signal S1; the second clock signal terminal CK2 of the first stage of shift register $SR_1$ is connected to the second pulse signal line 52 to receive the second pulse signal S2; and the reset terminal RST of the first stage of shift register $SR_1$ is connected to the third pulse signal line 53 to receive the third pulse signal S3;

the first clock signal terminal CK1 of the second stage of shift register $SR_2$ is connected to the third pulse signal line 53 to receive the third pulse signal S3; the second clock signal terminal CK2 of the second stage of shift register $SR_2$ is connected to the fourth pulse signal line 54 to receive the fourth pulse signal S4; and the reset terminal RST of the second stage of shift register $SR_2$ is connected to the second pulse signal line 52 to receive the second pulse signal S2;

the first clock signal terminal CK1 of the third stage of shift register $SR_3$ is connected to the second pulse signal line 52 to receive the second pulse signal S2; the second clock signal terminal CK2 of the third stage of shift register $SR_3$ is connected to the first pulse signal line 51 to receive the first pulse signal S1; and the reset terminal RST of the third stage of shift register $SR_3$ is connected to the fourth pulse signal line 54 to receive the fourth pulse signal S4;

the first clock signal terminal CK1 of the fourth stage of shift register $SR_4$ is connected to the fourth pulse signal line 54 to receive the fourth pulse signal S4; the second clock signal terminal CK2 of the fourth stage of shift register $SR_4$ is connected to the third pulse signal line 53 to receive the second pulse signal S3; and the reset terminal RST of the fourth stage of shift register $SR_4$ is connected to the first pulse signal line 51 to receive the third pulse signal S1;

Further, the gate driving circuit 3 further includes an initial signal line (not shown);

the input terminal IN of the first stage of shift register $SR_1$ is connected to the initial signal line to receive the initial signal STP; and the input terminal IN of the third stage of shift register $SR_3$ is connected to the output terminal $OUT_1$ of the first stage of shift register $SR^1$ to receive an output signal from the output terminal $OUT_1$ of the first stage of shift register $SR_1$;

the input terminal IN of the second stage of shift register $SR_2$ is connected to the initial signal line to receive the initial signal; and the input terminal IN of the fourth stage of shift register $SR_4$ is connected to the output terminal $OUT_2$ of the second stage of shift register $SR_2$ to receive an output signal from the output terminal $OUT_2$ of the second stage of shift register $SR_2$;

the first stage of shift register to the fourth stage of shift register described above is illustrated as an example, but the present disclosure is not limited thereto, and in actual operation, the shift registers just need to satisfy conditions below:

the input terminal IN of the first stage of shift register $SR_1$ is connected to the initial signal line to receive the initial signal STP; and the input terminal IN of the k-th stage of shift register $SR_k$ is connected to the output terminal $OUT_{(k-2)}$ of the (k−2)-th stage of shift register $SR_{(k-2)}$ to receive an output signal from the output terminal $OUT_{(k-2)}$ of the (k−2)-th stage of shift register $SR_{(k-2)}$;

the input terminal IN of the second stage of shift register $SR_2$ is connected to the initial signal line to receive the initial signal; and the input terminal IN of the j-th stage of shift register $SR_j$ is connected to the output terminal $OUT_{(j-2)}$ of the (j−2)-th stage of shift register $SR_{(j-2)}$ to receive an output signal from the output terminal $OUT_{(j-2)}$ of the (j−2)-th stage of shift register $SR_{(j-2)}$; where, k>1, j>2, and k is an odd number, j is an even number.

for an i-th stage of shift register $SR_i$:
the first clock signal terminal CK1 of the i-th stage of shift register $SR_i$ is connected to the first pulse signal line 51 to receive the first pulse signal S1; the second clock signal terminal CK2 of the i-th stage of shift register $SR_i$ is connected to the second pulse signal line 52 to receive the second pulse signal S2; and the reset terminal RST of the i-th stage of shift register $SR_i$ is connected to the third pulse signal line 53 to receive the third pulse signal S3;

for an (i+1)-th stage of shift register $SR_{(i+1)}$:
the first clock signal terminal CK1 of the (i+1)-th stage of shift register $SR_{(i+1)}$ is connected to the third pulse signal line 53 to receive the third pulse signal S3; the second clock signal terminal CK2 of the (i+1)-th stage of shift register $SR_{(i+1)}$ is connected to the fourth pulse signal line 54 to receive the fourth pulse signal S4; and the reset terminal RST of the (i+1)-th stage of shift register $SR_{(i+1)}$ is connected to the second pulse signal line 52 to receive the second pulse signal S2;

for an (i+2)-th stage of shift register $SR_{(i+2)}$:
the first clock signal terminal CK1 of the (i+2)-th stage of shift register $SR_{(i+2)}$ is connected to the second pulse signal line 52 to receive the second pulse signal S2; the second clock signal terminal CK2 of the (i+2)-th stage of shift register $SR_{(i+2)}$ is connected to the first pulse signal line 51 to receive the first pulse signal S1; and the reset terminal RST of the (i+2)-th stage of shift register $SR_{(i+2)}$ is connected to the fourth pulse signal line 54 to receive the fourth pulse signal S4;

for an (i+3)-th stage of shift register $SR_{(i+3)}$:
the first clock signal terminal CK1 of the (i+3)-th stage of shift register $SR_{(i+3)}$ is connected to the fourth pulse signal line 54 to receive the fourth pulse signal S4; the second clock signal terminal CK2 of the (i+3)-th stage of shift register SR$_{(i+3)}$ is connected to the third pulse signal line 53 to receive the second pulse signal S3; and the reset terminal RST of the (i+3)-th stage of shift register SR$_{(i+3)}$ is connected to the first pulse signal line 51 to receive the first pulse signal S1; where, i is a positive integer;

Further, as shown in FIG. 4, the shift register SR includes: a first capacitor C1, a second capacitor C2, a first transistor M1, a second transistor M2, a third transistor M3, a fourth transistor M4, a fifth transistor M5 and a sixth transistor M6;

a source electrode of the first transistor M1 is connected to a first level signal line VGH, and a drain electrode of the first transistor M1 is connected to the output terminal OUT through the second capacitor C2;

a source electrode of the second transistor M2 is connected to a gate electrode of the first transistor M1, a drain electrode of the second transistor M2 is connected to a second level signal line VGL, and a gate electrode of the second transistor M2 is connected to the reset terminal RST;

a source electrode of the third transistor M3 is connected to the first level signal line VGH, a drain electrode of the third transistor M3 is connected to the source electrode of the second transistor M2, and the gate electrode of the third transistor M3 is connected to the output terminal OUT through the second capacitor C2;

a source electrode of the fourth transistor M4 is connected to the output terminal OUT through the second capacitor C2 and is further connected to the gate electrode of the third transistor M3, a drain electrode of the fourth transistor M4 is connected to the input terminal IN, and a gate electrode of the fourth transistor M4 is connected to the first clock signal terminal CK1;

a source electrode of the fifth transistor M5 is connected to the first level signal line VGH, a drain electrode of the fifth transistor M5 is connected to the output terminal OUT, and a gate electrode of the fifth transistor M5 is connected to the first level signal line VGH through the first capacitor C1 and is further connected to the source electrode of the second transistor M2;

a source electrode of the sixth transistor M6 is connected to the output terminal OUT, a drain electrode of the sixth transistor M6 is connected to the second clock signal terminal CK2, and a gate electrode of the sixth transistor M6 is connected to the source electrode of the fourth transistor M4.

Specially as shown in FIGS. 3 and 4, the first level signal line VGH outputs a first level signal, the second level signal line VGL outputs a second level signal;

in the first stage of shift register SR$_1$:

The source electrode of the first transistor M1 is connected to the first level signal line VGH to receive the first level signal, and the drain electrode of the first transistor M1 is connected to the output terminal OUT$_1$ through the second capacitor C2, the output terminal OUT$_1$ outputs a signal to the first row of gate lines 2 (namely, the first row of gate lines G1);

The source electrode of the second transistor M2 is connected to the gate electrode of the first transistor M1, the drain electrode of the second transistor M2 is connected to the second level signal line VGL to receive the second level signal, and the gate electrode of the second transistor M2 is connected to the reset terminal RST, i.e. the gate electrode of the second transistor M2 is connected to the third pulse signal line 53 to receive the third pulse signal S3 as the reset signal;

The source electrode of the third transistor M3 is connected to the first level signal line VGH to receive the first level signal, the drain electrode of the third transistor M3 is connected to the source electrode of the second transistor M2, and the gate electrode of the third transistor M3 is connected to the output terminal OUT$_1$ through the second capacitor C2;

The source electrode of the fourth transistor M4 is connected to the output terminal OUT$_1$ through the second capacitor C2 and is further connected to the gate electrode of the third transistor M3, the drain electrode of the fourth transistor M4 is connected to the input terminal IN, and the gate electrode of the fourth transistor M4 is connected to the first clock signal terminal CK1, i.e. the gate electrode of the fourth transistor M4 is connected to the first pulse signal line 51 to receive the first pulse signal S1;

The source electrode of the fifth transistor M5 is connected to the first level signal line VGH to receive the first level signal, the drain electrode of the fifth transistor M5 is connected to the output terminal OUT$_1$, and the gate electrode of the fifth transistor M5 is connected to the first level signal line VGH through the first capacitor C1 and is further connected to the source electrode of the second transistor M2;

The source electrode of the sixth transistor M6 is connected to the output terminal OUT$_1$, the drain electrode of the sixth transistor M6 is connected to the second clock signal terminal CK2, i.e. the drain electrode of the sixth transistor M6 is connected to the second pulse signal line 52 to receive the second pulse signal S2, and the gate electrode of the sixth transistor M6 is connected to the source electrode of the fourth transistor M4.

Similarly, in the second stage of shift register SR$_2$:

The source electrode of the first transistor M1 is connected to the first level signal line VGH, and the drain electrode of the first transistor M1 is connected to the output terminal OUT$_2$ through the second capacitor C2, the output terminal OUT$_2$ outputs a signal to the second row of gate lines 2 (namely, the second row of gate lines G2);

The source electrode of the second transistor M2 is connected to the gate electrode of the first transistor M1, the drain electrode of the second transistor M2 is connected to the second level signal line VGL, and the gate electrode of the second transistor M2 is connected to the reset terminal RST, i.e. the gate electrode of the second transistor M2 is connected to the second pulse signal line 52 to receive the second pulse signal S2 as the reset signal;

The source electrode of the third transistor M3 is connected to the first level signal line VGH, the drain electrode of the third transistor M3 is connected to the source electrode of the second transistor M2, and the gate electrode of the third transistor M3 is connected to the output terminal OUT$_2$ through the second capacitor C2;

The source electrode of the fourth transistor M4 is connected to the output terminal OUT$_2$ through the second capacitor C2 and is further connected to the gate electrode of the third transistor M3, the drain electrode of the fourth transistor M4 is connected to the input terminal IN, and the gate electrode of the fourth transistor M4 is connected to the first clock signal terminal CK1, i.e. the gate electrode of the fourth transistor M4 is connected to the third pulse signal line 53 to receive the third pulse signal S3;

The source electrode of the fifth transistor M5 is connected to the first level signal line VGH, the drain electrode of the fifth transistor M5 is connected to the output terminal OUT$_2$, and the gate electrode of the fifth transistor M5 is connected to the first level signal line VGH through the first capacitor C1 and is further connected to the source electrode of the second transistor M2;

The source electrode of the sixth transistor M6 is connected to the output terminal OUT$_2$, the drain electrode of the sixth transistor M6 is connected to the second clock signal terminal CK2, i.e. the drain electrode of the sixth transistor M6 is connected to the fourth pulse signal line 54 to receive the fourth pulse signal S4, and the gate electrode of the sixth transistor M6 is connected to the source electrode of the fourth transistor M4.

Similarly, in the third stage of shift register SR$_3$:

The source electrode of the first transistor M1 is connected to the first level signal line VGH, and the drain electrode of the first transistor M1 is connected to the output terminal OUT$_3$ through the second capacitor C2, the output terminal OUT$_3$ outputs a signal to the third row of gate lines 2 (namely, the third row of gate lines G3);

The source electrode of the second transistor M2 is connected to the gate electrode of the first transistor M1, the drain electrode of the second transistor M2 is connected to the second level signal line VGL, and the gate electrode of the second transistor M2 is connected to the reset terminal RST, i.e. the gate electrode of the second transistor M2 is connected to the fourth pulse signal line 54 to receive the fourth pulse signal S4;

The source electrode of the third transistor M3 is connected to the first level signal line VGH, the drain electrode of the third transistor M3 is connected to the source electrode of the second transistor M2, and the gate electrode of the third transistor M3 is connected to the output terminal OUT$_3$ through the second capacitor C2;

The source electrode of the fourth transistor M4 is connected to the output terminal OUT$_3$ through the second capacitor C2 and is further connected to the gate electrode of the third transistor M3, the drain electrode of the fourth transistor M4 is connected to the input terminal IN, and the gate electrode of the fourth transistor M4 is connected to the first clock signal terminal CK1, i.e. the gate electrode of the fourth transistor M4 is connected to the second pulse signal line 52 to receive the second pulse signal S2;

The source electrode of the fifth transistor M5 is connected to the first level signal line VGH, the drain electrode of the fifth transistor M5 is connected to the output terminal OUT$_3$, and the gate electrode of the fifth transistor M5 is connected to the first level signal line VGH through the first capacitor C1 and is further connected to the source electrode of the second transistor M2;

The source electrode of the sixth transistor M6 is connected to the output terminal OUT$_3$, the drain electrode of the sixth transistor M6 is connected to the second clock signal terminal CK2, i.e. the drain electrode of the sixth transistor M6 is connected to the first pulse signal line 51 to receive the first pulse signal S1, and the gate electrode of the sixth transistor M6 is connected to the source electrode of the fourth transistor M4.

Similarly, in the fourth stage of shift register SR$_4$:

The source electrode of the first transistor M1 is connected to the first level signal line VGH, and the drain electrode of the first transistor M1 is connected to the output terminal OUT$_4$ through the second capacitor C2, the output terminal OUT$_4$ outputs a signal to the fourth row of gate lines 2 (namely, the fourth row of gate lines G4);

The source electrode of the second transistor M2 is connected to the gate electrode of the first transistor M1, the drain electrode of the second transistor M2 is connected to the second level signal line VGL, and the gate electrode of the second transistor M2 is connected to the reset terminal RST, i.e. the gate electrode of the second transistor M2 is connected to the first pulse signal line 51 to receive the first pulse signal S1 as the reset signal;

The source electrode of the third transistor M3 is connected to the first level signal line VGH, the drain electrode of the third transistor M3 is connected to the source electrode of the second transistor M2, and the gate electrode of the third transistor M3 is connected to the output terminal OUT$_4$ through the second capacitor C2;

The source electrode of the fourth transistor M4 is connected to the output terminal OUT$_4$ through the second capacitor C2 and is further connected to the gate electrode of the third transistor M3, the drain electrode of the fourth transistor M4 is connected to the input terminal IN, and the gate electrode of the fourth transistor M4 is connected to the first clock signal terminal CK1, i.e. the gate electrode of the fourth transistor M4 is connected to the fourth pulse signal line 54 to receive the fourth pulse signal S4;

The source electrode of the fifth transistor M5 is connected to the first level signal line VGH, the drain electrode of the fifth transistor M5 is connected to the output terminal OUT$_4$, and the gate electrode of the fifth transistor M5 is connected to the first level signal line VGH through the first capacitor C1 and is further connected to the source electrode of the second transistor M2;

The source electrode of the sixth transistor M6 is connected to the output terminal OUT$_4$, the drain electrode of the sixth transistor M6 is connected to the second clock signal terminal CK2, i.e. the drain electrode of the sixth transistor M6 is connected to the third pulse signal line 53 to receive the third pulse signal S3, and the gate electrode of the sixth transistor M6 is connected to the source electrode of the fourth transistor M4.

Figure 5:
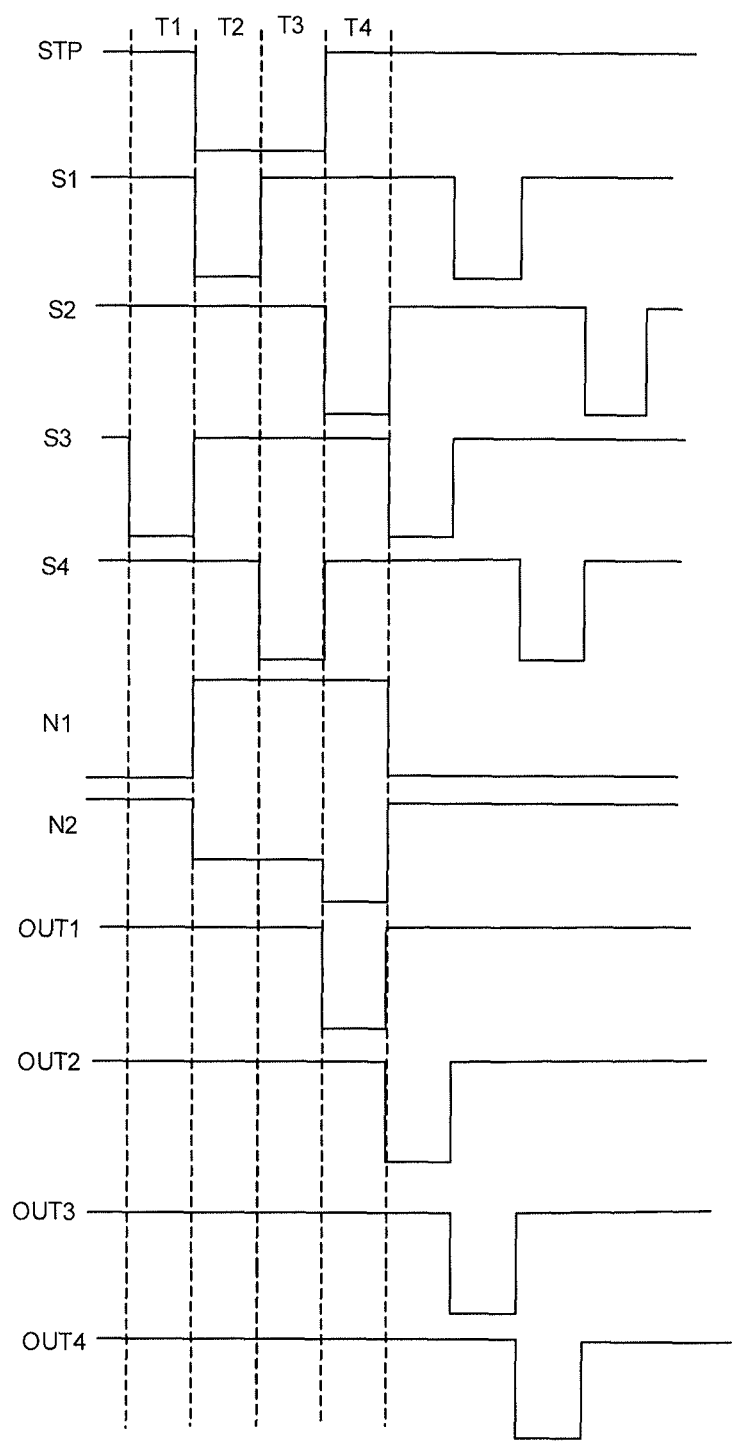
FIG. 5 is a timing diagram showing signals of a gate driving circuit according to the present disclosure.

A driving process and operating principles of the gate driving circuit will be introduced below, as shown in FIGS. 3, 4 and 5.

For the first stage of shift register SR$_1$:

In a time period T1, the third pulse signal S3 is at a low level and is used as the reset signal to control the second transistor M2 to be turned on; a second level signal from second level signal line VGL (in a time period T1, the second level signal is at a low level voltage) is transmitted to a first node N1 through both the source electrode and the drain electrode of the second transistor M2, namely, the low level of the second level signal is transmitted to the first node N1 through the turned-on second transistor M2, so that the first node N1 is at a low level to control the fifth transistor M5 and the first transistor M1 to be turned on; a first level signal from the first level signal line VGH (in a time period T1, the first level signal is at a high level voltage) is transmitted to a second node N2 through both the source electrode and the drain electrode of the first transistor M1, namely, the high level of the first level signal is transmitted to second node N2 through the turned-on first transistor M1, so that the second node N2 is at a high level, and at this time, the first capacitor C1 and the second capacitor C2 respectively store potentials of the first node N1 and the second node N2. Since the second node N2 is at a high level, the sixth transistor M6 is turned off. Since the first node N1 is at a low level, the fifth transistor M5 is turned on. The first level signal (in a time period T1, the first level signal is at a high level voltage) is transmitted to the output terminal OUT through both the source electrode and the drain electrode of the fifth transistor M5 (namely, through the turned-on fifth transistor M5), and hence the output terminal OUT of the first stage of shift register SR$_1$ outputs the high level of the first level signal, namely, in a time period T1, the output terminal OUT$_1$ of the first stage of shift register SR$_1$ outputs the high level.

In a time period T2, the first pulse signal S1 is at a low level and the initial signal STP is at a low level, and thus the fourth transistor M4 is turned on; the low level of the initial signal STP is transferred to the gate electrode of the third transistor M3 through both the source electrode and the drain electrode of the fourth transistor M4 (namely, the low level of the initial signal STP is transferred to the gate electrode of the third transistor M3 through the turned-on fourth transistor M4), and thus the third transistor M3 is also turned on; then, the first node N1 is at a high level of the first level signal, and the second node N2 is at a low level, and at this time, the first capacitor C1 and the second capacitor C2 respectively store potentials of the first node N1 and the second node N2. Thus, the fifth transistor M5 and the first transistor M1 are turned off, and the sixth transistor M6 is turned on. The output terminal OUT outputs a high level of the second pulse signal S2.

In a time period T3, due to the charge maintaining effect of the first capacitor C1 and the second capacitor C2, the first node N1 and the second node N2 maintain their potentials as in the time period T2 so that the sixth transistor M6 is still turned on. The high level of the second pulse signal S2 is used as the output signal at the output terminal OUT, and hence the output terminal OUT outputs a high level.

In a time period T4, the first node N1 maintains its potential as in the time period T3. However, because of the coupling effect of the second capacitor C2, the potential of the second node N2 is further pulled down in order to ensure that the sixth transistor M6 is still turned on. The low level of the second pulse signal S2 is used as the output signal at the output terminal OUT, and hence the output terminal OUT outputs a low level (i.e. the low level of the second pulse signal S2).

Similarly, for the second stage of shift register SR$_2$, the driving process thereof is substantially the same as that of the first stage of shift register SR$_1$, except that in the second stage of shift register SR$_2$, the third pulse signal S3 is applied to the first clock signal terminal (i.e. the gate electrode of the fourth transistor M4), the fourth pulse signal S4 is applied to the second clock signal terminal (i.e. the drain electrode of the sixth transistor M6), and the second pulse signal S2 is used as the reset signal.

Similarly, for the third stage of shift register SR$_3$, the driving process thereof is substantially the same as that of the first stage of shift register SR$_1$, except that in the third stage of shift register SR$_3$, the second pulse signal S2 is applied to the first clock signal terminal (i.e. the gate electrode of the fourth transistor M4), the first pulse signal S1 is applied to the second clock signal terminal (i.e. the drain electrode of the sixth transistor M6), and the fourth pulse signal S4 is used as the reset signal.

Similarly, for the fourth stage of shift register SR$_4$, the driving process thereof is substantially the same as that of the first stage of shift register SR$_1$, except that in the fourth stage of shift register SR$_4$, the fourth pulse signal S4 is applied to the first clock signal terminal (i.e. the gate electrode of the fourth transistor M4), the third pulse signal S3 is applied to the second clock signal terminal (i.e. the drain electrode of the sixth transistor M6), and the first pulse signal S1 is used as the reset signal.

Similarly, other stages of shift registers operate likewise and will not be repeatedly discussed again here in the embodiment, and reference may be made to the above description with respect to the driving processes of the first, second, third and fourth stages of shift registers, for example, the fifth stage of shift register SR$_5$ operates in a same way as the first stage of shift register SR$_1$ does except that the initial terminal IN of the fifth stage of shift register SR$_5$ is connected to the output OUT$_3$ of the third stage of shift register SR$_3$; Similarly, the sixth stage of shift register (not shown) operates in a same way as the second stage of shift register SR$_2$ does except that the initial terminal IN of the sixth stage of shift register is connected to the output OUT$_4$ of the fourth stage of shift register SR$_4$; Similarly, the seventh stage of shift register (not shown) operates in a same way as the third stage of shift register SR$_3$ does except that the initial terminal IN of the seventh stage of shift register (not shown) is connected to the output OUT$_5$ of the fifth stage of shift register SR$_5$; Similarly, the eighth stage of shift register (not shown) operates in a same way as the fourth stage of shift register SR$_4$ does except that the initial terminal IN of the eighth stage of shift register is connected to the output OUT of the sixth stage of shift register.

Further, the first level signal line VGH outputs the first level signal, and the second level signal line VGL outputs the second level signal. The level values of both the first level signal and the second level signal are constant, the level value of the first level signal is in a range from 0V to 25V, the level value of the second level signal is in a range from −25V to 0V, and the level value of the first level signal is greater than the level value of the second level signal.

Further, a phase difference between a consecutive two of the first pulse signal S1, the second pulse signal S2, the third pulse signal S3 and the fourth pulse signal S4 is a quarter of a pulse cycle. That is, the phase of the first pulse signal S2 is shifted in a direction by a quarter of a pulse cycle with respect to the phase of the first pulse signal S1, the phase of the third pulse signal S3 is shifted in the direction by a quarter of the pulse cycle with respect to the phase of the second pulse signal S2, and the phase of the fourth pulse signal S4 is shifted in the direction by a quarter of the pulse cycle with respect to the phase of the third pulse signal S3. The first pulse signal S1, the second pulse signal S2, the third pulse signal S3 and the fourth pulse signal S4 have the high level in a range from 0V to 25V, and have the low level in a range from −25V to 0V.

It is noted that:

1. in the present embodiment, all of the transistors are low temperature polycrystalline silicon thin film transistors. Since the low temperature polycrystalline silicon thin film transistor per se has a high electronic mobility, a phenomenon of the delay in turning on or off the transistor can be alleviated. In addition, the description of the transistors as low temperature polycrystalline silicon thin film transistors is merely exemplary, but the present disclosure is not limited thereto. In other embodiments, all of the transistors may alternatively be amorphous silicon transistors or oxide transistors, which is not limited in the present embodiment.

2. in the present embodiment, all of the transistors are PMOS transistors for example, but the present disclosure is not limited thereto. In other embodiments, all of the transistors may also be NMOS transistors for example, but the present disclosure is also not limited thereto. The driving signals in the case that the NMOS transistors are employed are inverse to the driving signals in the case that the PMOS transistors are employed, which is not discussed again in the present embodiment.

Figure 6:
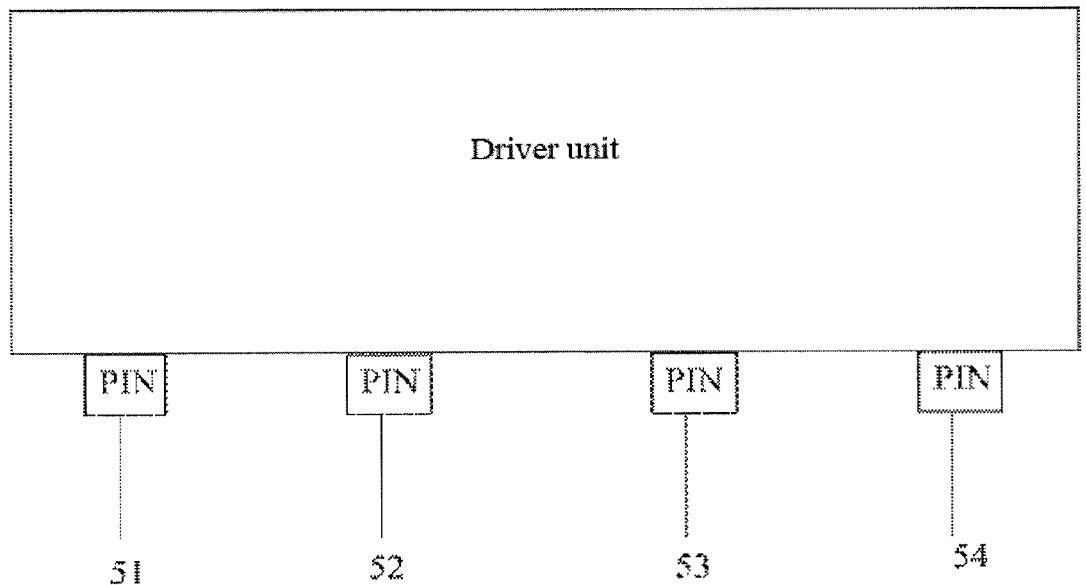
FIG. 6 is a schematic diagram showing the connections between the pins of the driver unit and various signal lines according to the present disclosure.

With the TFT array substrate according to the embodiment of the present disclosure, the pulse signal applied to the clock signal terminal is reused as the reset signal applied to the reset terminal, so as to omit resetting signal lines individually providing the reset signals, so that the amount of signal lines can be reduced in order to narrow the border width of the TFT array substrate (considering that the signal lines are generally disposed at the border area) and hence the amount of pins PIN (through which the driver unit outputs signals to various signal lines) of the drive unit is further reduced correspondingly. As shown in FIG. 6, there are only four signal lines, i.e. the first pulse signal line 51, the second pulse signal line 52, the third pulse signal line 53, and the fourth pulse signal line 54, thereby decreasing the load and the power consumption of the driver unit and hence decreasing the power consumption of the TFT array substrate, so that the costs of the TFT array substrate are saved, the yield of the TFT array substrate is improved, and the border width of the TFT array substrate is narrowed. The arrangement of all signal lines shown in FIG. 6 is exemplary, and the present disclosure is not limited thereto.

Figure 7:
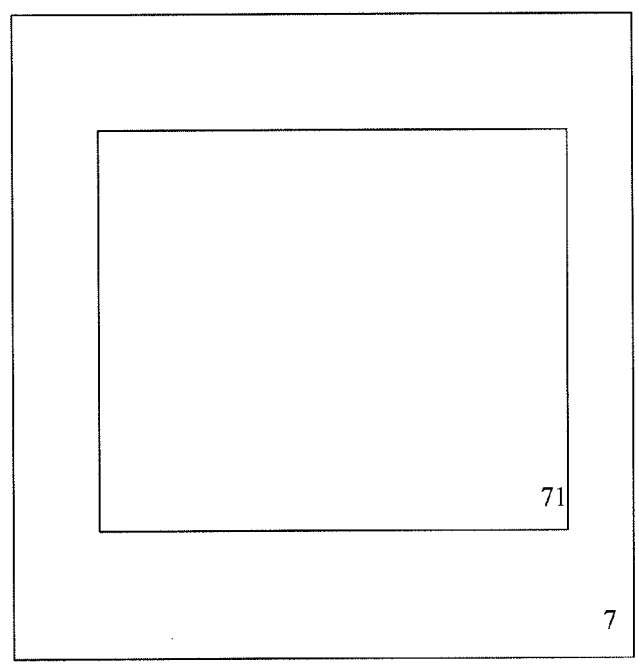
FIG. 7 is a schematic diagram showing the structure of a display panel according to the present disclosure.

As shown in FIG. 7, an embodiment of the present disclosure further provides a display panel 7 including a TFT array substrate 71. The TFT array substrate 71 may be the TFT array substrate described in any of the above embodiments. In general, the display panel is a liquid crystal display panel which includes a TFT array substrate, a color filter substrate disposed opposite to the TFT array substrate, and a liquid crystal layer disposed between the color filter substrate and the TFT array substrate. It is noted that the liquid crystal display panel of the present embodiment is merely exemplary, and the present disclosure is not limited thereto. In other embodiments, the display panel may also be an organic light emitting diode (OLED) display panel or an active matrix organic light emitting diode display panel (AMOLED display panel).

Figure 8:
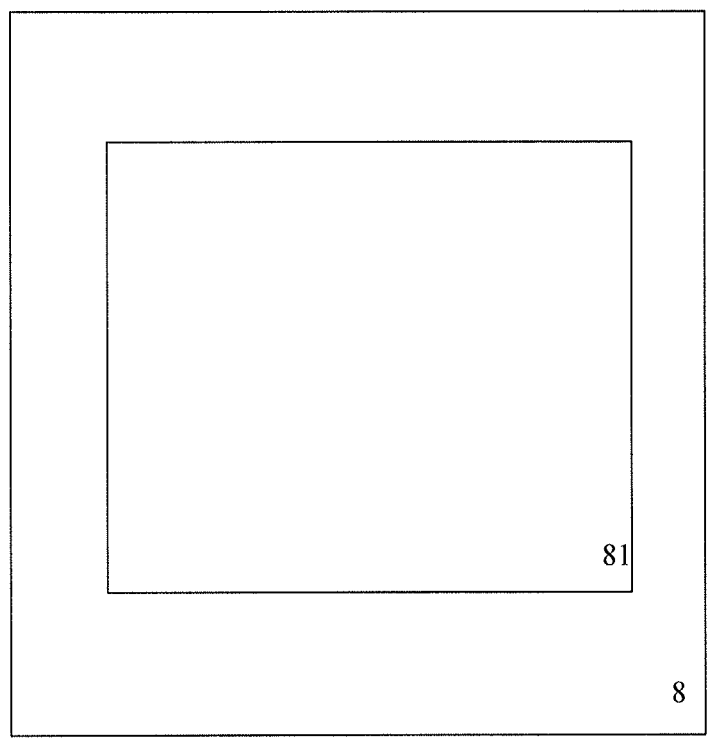
FIG. 8 is a schematic diagram showing the structure of a display device according to the present disclosure.

As shown in FIG. 8, an embodiment of the present disclosure further provides a display device 8 including a TFT array substrate 81. The TFT array substrate 81 may be the TFT array substrate described in any of the above embodiments. In general, the display device is a liquid crystal display device, which includes a TFT array substrate, a color filter substrate disposed opposite to the TFT array substrate, and a liquid crystal layer disposed between the color filter substrate and the TFT array substrate. The liquid crystal display device further includes a backlight module disposed at one side of the TFT array substrate apart from the color filter substrate. It is noted that the liquid crystal display device of the present disclosure is merely exemplary, and the present disclosure is not limited thereto. In other embodiments, the display device may also be an organic light emitting diode (OLED) display device or an active matrix organic light emitting diode display device (AMOLED display device). The display device may also be electronic paper, which is not repeatedly discussed again in the present embodiment.

As can be seen from the above, with the TFT array substrate, the display panel and the display device according to the embodiments of the present disclosure, the pulse signal applied to the clock signal terminal is reused as the reset signal applied to the reset terminal so as to omit resetting signal lines individually providing the reset signals, so that the amount of signal lines can be reduced to narrow the border width of the TFT array substrate (considering that the signal lines are generally disposed at the border area) and thus the amount of pins PIN (through which the driver unit outputs signals to various signal lines) of the drive unit is further reduced correspondingly, thereby decreasing the load and the power consumption of the driver unit and hence decreasing the power consumption of the display device, and the cost of the display device is saved, the yield of the display device is improved, and further the border width of the display device is narrowed.

It is noted that the dynamic shift registers provided by all of the embodiments of the present disclosure have a small size since the transistors thereof are low temperature polycrystalline silicon thin film transistors, and thus the shift registers (may be dynamic shift registers) may be integrated in the display panel.

The preferable embodiments of the present disclosure are merely described as above, but are not intended to make limitation in some form to the present disclosure. Although the preferable embodiments of the present disclosure are disclosed as above, the present disclosure is not limited thereto. Without departing from the technical solutions of the present disclosure, various changes modifications, and the equivalent embodiments for the present disclosure can be made to the technical solutions by those skilled in the art by using the disclosed method and the technical content. Therefore, without departing from the technical solutions of the present disclosure, any simple modifications, equivalent changes, and improvements made to the above embodiments according to technical essences of the present disclosure, should fall into the scope of protection of the technical solutions of the present disclosure.

What is claimed is:

1. A TFT array substrate, comprising:
   a plurality of gate lines; and
   a gate driving circuit connected to the gate lines, comprising a plurality of stages of shift registers, wherein odd-numbered stages of shift registers from the plurality of stages of shift registers are cascaded-connected to each other, even-numbered stages of shift registers from the plurality of stages of shift registers are cascaded-connected to each other, and the odd-numbered stages of shift registers and the even-numbered stages of shift registers are disposed at both ends of the gate lines, respectively,
   wherein the gate driving circuit further comprises a first pulse signal line, a second pulse signal line, a third pulse signal line and a fourth pulse signal line, and each of the plurality of stages of shift registers comprises a first clock signal terminal, a second clock signal terminal, and a reset terminal,
   wherein the first clock signal terminal of the i-th stage of shift register is connected to the first pulse signal line to receive a first pulse signal; the second clock signal terminal of the i-th stage of shift register is connected to the second pulse signal line to receive a second pulse signal,
   wherein the reset terminal of the i-th stage of shift register is connected to the third pulse signal line to receive a third pulse signal, wherein i is a positive integer, and
   wherein the first clock signal terminal of the (i+1)-th stage of shift register is connected to the third pulse signal line to receive the third pulse signal; the second clock signal terminal of the (i+1)-th stage of shift register is connected to the fourth pulse signal line to receive a fourth pulse signal; and the reset terminal of the (i+1)-th stage of shift register is connected to the second pulse signal line to receive the second pulse signal.

2. The TFT array substrate of claim 1, wherein,
   the first clock signal terminal of the (i+2)-th stage of shift register is connected to the second pulse signal line to receive the second pulse signal; the second clock signal terminal of the (i+2)-th stage of shift register is connected to the first pulse signal line to receive the first pulse signal, and the reset terminal of the (i+2)-th stage of shift register is connected to the fourth pulse signal line to receive the fourth pulse signal; and the first clock signal terminal of the (i+3)-th stage of shift register is connected to the fourth pulse signal line to receive the fourth pulse signal; the second clock signal terminal of the (i+3)-th stage of shift register is connected to the third pulse signal line to receive the third pulse signal; and the reset terminal of the (i+3)-th stage of shift register is connected to the first pulse signal line to receive the first pulse signal.

3. The TFT array substrate of claim 2, wherein, the gate driving circuit further comprises an initial signal line; and each stage of the plurality of stages of shift registers further comprises an input terminal and an output terminal, with the output terminal of each stage of the plurality of stages of the shift registers being connected to the respective gate line;

the input terminal of the first stage of shift register is connected to the initial signal line to receive an initial signal; and the input terminal of the k-th stage of shift register is connected to the output terminal of the (k−2)-th stage of shift register to receive an output signal from the output terminal of the (k−2)-th stage of shift register; and the input terminal of the second stage of shift register is connected to the initial signal line to receive the initial signal; and the input terminal of the j-th stage of shift register is connected to the output terminal of the (j−2)-th stage of shift register to receive an output signal from the output terminal of the (j−2)-th stage of shift register, wherein, k>1, j>2, and k is an odd number, j is an even number.

4. The TFT array substrate of claim 3, wherein, the shift register comprises: a first capacitor, a second capacitor, a first transistor, a second transistor, a third transistor, a fourth transistor, a fifth transistor and a sixth transistor;

a source electrode of the first transistor is connected to a first level signal line, and a drain electrode of the first transistor is connected to the output terminal through the second capacitor;

a source electrode of the second transistor is connected to a gate electrode of the first transistor, a drain electrode of the second transistor is connected to a second level signal line, and a gate electrode of the second transistor is connected to the reset terminal;

a source electrode of the third transistor is connected to the first level signal line, a drain electrode of the third transistor is connected to the source electrode of the second transistor, and the gate electrode of the third transistor is connected to the output terminal through the second capacitor;

a source electrode of the fourth transistor is connected to the output terminal through the second capacitor and is further connected to the gate electrode of the third transistor, a drain electrode of the fourth transistor is connected to the input terminal, and a gate electrode of the fourth transistor is connected to the first clock signal terminal;

a source electrode of the fifth transistor is connected to the first level signal line, a drain electrode of the fifth transistor is connected to the output terminal, and a gate electrode of the fifth transistor is connected to the first level signal line through the first capacitor and is further connected to the source electrode of the second transistor; and a source electrode of the sixth transistor is connected to the output terminal, a drain electrode of the sixth transistor is connected to the second clock signal terminal, and a gate electrode of the sixth transistor is connected to the source electrode of the fourth transistor.

5. The TFT array substrate of claim 4, wherein, all of the transistors are low temperature polycrystalline silicon thin film transistors or PMOS transistors.

6. The TFT array substrate of claim 2, wherein, a phase difference between adjacent two of the first pulse signal S1, the second pulse signal S2, the third pulse signal S3 and the fourth pulse signal S4 is a quarter of a pulse cycle.

7. A display panel, comprising a TFT array substrate, where the TFT array substrate comprises:

a plurality of gate lines; and a gate driving circuit connected to the gate lines, comprising a plurality of stages of shift registers, wherein, odd-numbered stages of shift registers from the plurality of stages of shift registers are cascaded-connected to each other, even-numbered stages of shift registers from the plurality of stages of shift registers are cascaded-connected to each other, and the odd-numbered stages of shift registers and the even-numbered stages of shift registers are disposed at both ends of the gate lines, respectively, wherein gate driving circuit further comprises a first pulse signal line, a second pulse signal line, a third pulse signal line and a fourth pulse signal line, and each of the plurality of stages of shift registers comprises a first clock signal terminal, a second clock signal terminal, and a reset terminal, wherein the first clock signal terminal of the i-th stage of shift register is connected to the first pulse signal line to receive a first pulse signal; the second clock signal terminal of the i-th stage of shift register is connected to the second pulse signal line to receive a second pulse signal; and the reset terminal of the i-th stage of shift register is connected to the third pulse signal line to receive a third pulse signal; wherein, i is a positive integer, wherein the first clock signal terminal of the (i+1)-th stage of shift register is connected to the third pulse signal line to receive the third pulse signal; the second clock signal terminal of the (i+1)-th stage of shift register is connected to the fourth pulse signal line to receive a fourth pulse signal, and wherein the reset terminal of the (i+1)-th stage of shift register is connected to the second pulse signal line to receive the second pulse signal.

8. A display device, comprising a TFT array substrate, where the TFT array substrate comprises:

a plurality of gate lines; and a gate driving circuit connected to the gate lines, comprising a plurality of stages of shift registers, wherein odd-numbered stages of shift registers from the plurality of stages of shift registers are cascaded-connected to each other, even-numbered stages of shift registers from the plurality of stages of shift registers are cascaded-connected to each other, and the odd-numbered stages of shift registers and the even-numbered stages of shift registers are disposed at both ends of the gate lines, respectively, wherein the gate driving circuit further comprises a first pulse signal line, a second pulse signal line, a third pulse signal line and a fourth pulse signal line, and each of the plurality of stages of shift registers comprises a first clock signal terminal, a second clock signal terminal, and a reset terminal, wherein the first clock signal terminal of the i-th stage of shift register is connected to the first pulse signal line to receive a first pulse signal; the second clock signal terminal of the i-th stage of shift register is connected to the second pulse signal line to receive a second pulse signal; and the reset terminal of the i-th stage of shift register is connected to the third pulse signal line to receive a third pulse signal; wherein, i is a positive integer, wherein the first clock signal terminal of the (i+1)-th stage of shift register is connected to the third pulse signal line to receive the third pulse signal; the second clock signal terminal of the (i+1)-th stage of shift register is connected to the fourth pulse signal line to receive a fourth pulse signal, and wherein the reset terminal of the (i+1)-th stage of shift register is connected to the second pulse signal line to receive the second pulse signal.

* * * * *